(12) United States Patent
Sono et al.

(10) Patent No.: US 6,935,598 B2
(45) Date of Patent: Aug. 30, 2005

(54) WIRE RETAINER

(75) Inventors: Yoshiyuki Sono, Takefu (JP);
Toshiyuki Nogome, Takefu (JP)

(73) Assignee: Orion Electric Co., Ltd., Fukui (JP)

( * ) Notice: Subject to any disclaimer, the term of this patent is extended or adjusted under 35 U.S.C. 154(b) by 0 days.

(21) Appl. No.: 10/706,883

(22) Filed: Nov. 12, 2003

(65) Prior Publication Data

US 2004/0099773 A1 May 27, 2004

(30) Foreign Application Priority Data

Nov. 22, 2002 (JP) ........................................ 2002-339882

(51) Int. Cl.⁷ ............................................... F16B 15/00
(52) U.S. Cl. ...................................... 248/71; 248/74.4
(58) Field of Search ........................... 248/71, 65, 74.1, 248/74.2, 74.4, 73

(56) References Cited

U.S. PATENT DOCUMENTS

| | | | | |
|---|---|---|---|---|
| 4,564,163 A | * | 1/1986 | Barnett ......................... | 248/71 |
| 4,614,321 A | * | 9/1986 | Andre ........................ | 248/74.2 |
| 4,917,340 A | * | 4/1990 | Juemann et al. ........... | 248/74.2 |
| 6,123,580 A | * | 9/2000 | Bendorf et al. ............. | 439/567 |
| 6,371,419 B1 | * | 4/2002 | Ohnuki ....................... | 248/74.2 |
| 6,669,149 B2 | * | 12/2003 | Akizuki ....................... | 248/71 |

FOREIGN PATENT DOCUMENTS

| | | |
|---|---|---|
| JP | 4-029399 | 1/1992 |
| JP | 5-145246 | 6/1993 |
| JP | 5-226855 | 9/1993 |
| JP | 9-237983 | 9/1997 |

\* cited by examiner

Primary Examiner—Ramon O Ramirez
(74) Attorney, Agent, or Firm—Flynn, Thiel, Boutell & Tanis, P.C.

(57) ABSTRACT

It is an object of the invention to provide a wire retainer capable of easily mounting a wire on a retainer part and of simply fixing the wire retainer to a circuit board. A lower part of a long cylindrical body forms a fixed part which is fixed to the hole defined in the circuit board by a solder, and a base part of a retainer member is fixed to a substantially central part of the long cylindrical body. The base part has an extension part extending upward therefrom and a restriction part is fixed to an upper end of the extension part and extends downward along an upper portion of the long cylindrical body. A lead wire is inserted between the restriction part and the upper portion and retained by the retainer member.

19 Claims, 3 Drawing Sheets

WIRE RETAINER

FIELD OF THE INVENTION

The invention relates to a wire retainer to be used for retaining a wire such as a cable and so forth which is wired in the case of mounting electronic components on a circuit board.

BACKGROUND OF THE INVENTION

A circuit board on which semiconductor devices such as ICs, transistors, and electronic components such as resistors, capacitors are mounted has been used, and wires such as a cable and so forth for wiring the electronic components mounted on the circuit board. If the wires such as a cable and so forth are disposed on the circuit board as they are, they are inconvenient to handle and there is a likelihood that they are caught carelessly to come off from the circuit board, and hence a wire retainer for holding a cable on the circuit board is used.

For example, JP 1993-226855A discloses that an engagement claw of a retainer is inserted into an engagement hole to fix the retainer, a protrusion is provided on a bow-shaped spring which is provided on an engagement portion when fixing the retainer to push a wire retainer, thereby preventing the wires from being come off. Further, JP 1997-237983A discloses a cable retainer portion comprising a helical retainer which is helically wound around a cable to retain the cable, and a bar-shaped interval keeping portion which is integrated with the helical retainer portion at right angles therewith at the center thereof. Still further, JP1993-145246A discloses a wire supporter comprising a clamp portion for clamping a wire, a fixed portion to be fixed to flying boat member inside an electric appliance, and a damper portion formed of a curbed member and provided between the clamp portion and the fixed portion. More still further, JP 1992-29399A discloses a cable holder comprising soft elastic rubber adhered onto a circuit board, a metal wire which is bent in U-shape and one base thereof is allowed to penetrate the circuit board to project therefrom and embedded therein while the other tip end of the metal wire is forced to strike against to contact the soft elastic rubber.

As disclosed in the foregoing references, there is conventionally proposed a wire retainer formed of a flexible material to retain a wire or a retainer which is deformed to retain the wire.

However, in the case where the flexible material is used for a retainer, the wire is prone to come off as disclosed in the first reference, and hence it is considered to select a material having less flexibility, which is however make it difficult to insert the wire into the retainer. Further, although it is surely possible to prevent the wire from being come off from the retainer if the retainer is deformed to wind around the wire, it needs a winding operation, causing a problem in respect of working efficiency. Further, according to the conventional wire retainer, since it is necessary to provide holes for the wire retainer on the circuit, the necessity of such holes has to be considered in advance at the stage of designing the circuit board, resulting in restrictions on the design of the circuit board. Still further, it is difficult to add the wire retainer when the wiring is necessitated at the stage where the electronic components were mounted on the circuit board.

SUMMARY OF THE INVENTION

Therefore, it is an object of the invention to provide a wire retainer capable of easily mounting a wire on a retainer and simply fixing the wire retainer on the circuit board.

To achieve the above object, the wire retainer according to the first aspect of the invention comprises a supporting member having a fixed part at a lower portion, the fixed part being fixed to a hole defined in a circuit board, a retainer member fixed to the supporting member for retaining a lead wire, characterized in that the retainer member has a base part fixed to a central portion of the supporting member and extended upward to retain the wire, and a restriction part fixed to an upper end of the base part at its one end and extending downward from one end to the other end along the supporting member. Further, the second aspect of the invention is characterized in that the base part is fixed to the central portion of the supporting member and extended upward from both sides thereof and restriction parts are fixed to each upper end of the base part. Still further, the third aspect of the invention is characterized in that the retainer member is made of a flexible material. Further, the fourth aspect of the invention is characterized in that an upper portion of the supporting member positioned above a part thereof to which the retainer member is fixed is covered with an insulating material. Further, the fifth aspect of the invention is characterized in that a protrusion which can be inserted into and fixed to a hole defined in the circuit board is provided on a lower surface of the base part.

With the configuration as set forth above, the wire can be easily inserted into the retainer, thereby preventing the wire from being come off. That is, since the inserting port of the wire is formed by the support member made of metal, and a restriction portion of the retainer member which is formed to extend downward along the support member, and the supporting member is made of metal, even if a material having less flexibility to some extent is used as a retainer member, the retainer member is deformed by the insertion pressure of the wire so that the wire can be easily inserted into the retainer member. Further, since the restriction portion extends downward and the supporting member is made of metal, the insertion hole of the wire is hardly deformed to prevent the wire from being come off.

Still further, since the supporting member is made of metal, it can be easily fixed to the hole of the circuit board through which an electronic component is inserted and mounted by soldering like the other electronic components. More still further, the mounting of the wire retainer can be automated like the other electronic components, and hence it can be more simply fixed to the circuit board. Since the holes thorough which the electronic components are mounted are defined in the circuit board so as to generally cope with various circuit patterns according to a design of the circuit, there exists a hole which is not used for certain circuit pattern. The wire retainer of the invention can replace such a non-use hole with the hole for the wire retainer and also the wire retainer of the invention can be fixed to the circuit board even after the electronic components were mounted on the circuit board.

Further, since the base part is formed at both sides of the supporting member, the number of wires to be retained can be increased. Still further, the upper portion of the part of the long cylindrical body to which the retainer member of the supporting member is fixed is covered with the insulating material to prevent short of electricity from flowing from the wire from to the supporting member.

More still further, since the protrusion capable of being inserted into the hole defined in the circuit board is provided on the lower surface of the base part, the wire retainer can be surely fixed to the circuit board with certainty to prevent it from being turned. Since the holes through which an electronic component is mounted are almost defined in the circuit board as paired, the hole through which the protrusion provided on the lower surface of the base part is inserted and fixed together with the hole for the supporting member can use these pair of holes. Accordingly, the fixation of the wire retainer to the circuit board can be easily mechanically effected by use of an automatic mounting device for use in the mounting of other electronic components.

PREFERRED EMBODIMENT OF THE INVENTION

Embodiments of the invention are now described in detail with reference to the attached drawings.

Figure 1:
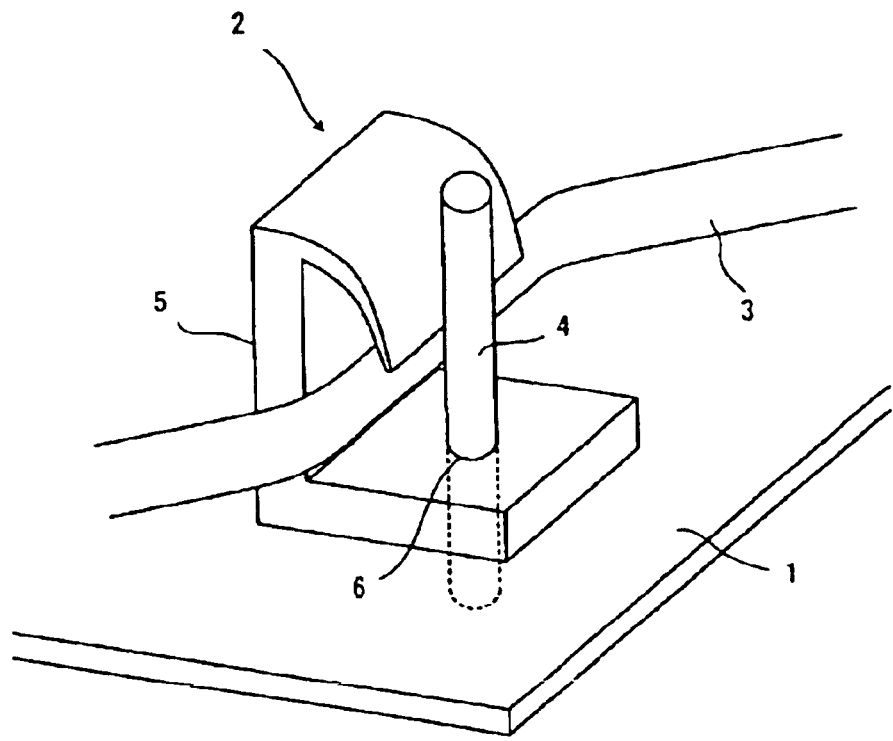
FIG. 1 is a schematic perspective view showing a state where a wire retainer is fixed onto a circuit board according to a first embodiment of the invention.
Figure 2:
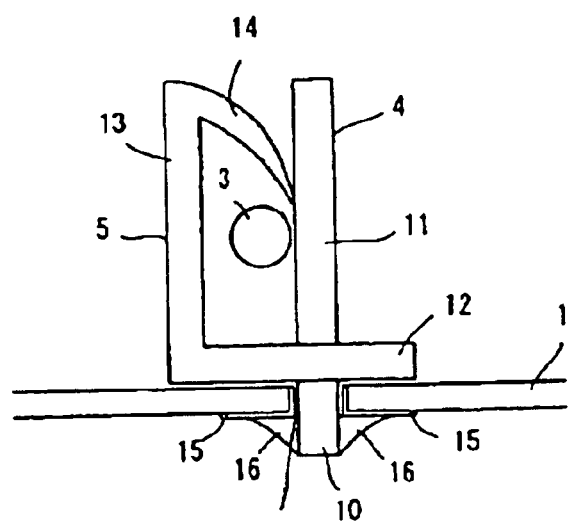
FIG. 2 is a schematic sectional view showing a state where the wire retainer is fixed onto the circuit board according to the first embodiment of the invention.
Figure 3A:
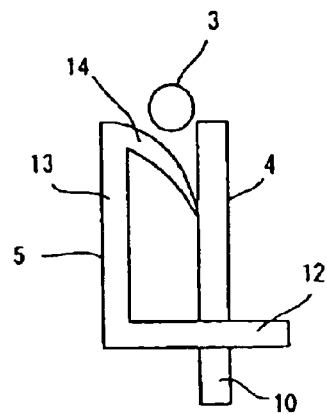
FIGS. 3(A), 3(B) and 3(C) are views for explaining the fixation of a lead wire to the wire retainer according to the first embodiment of the invention.
Figure 3B:
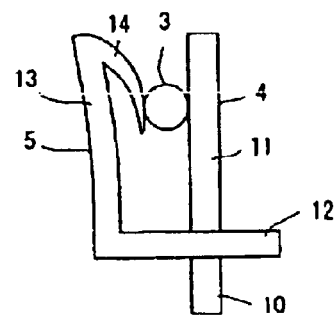
Figure 3C:
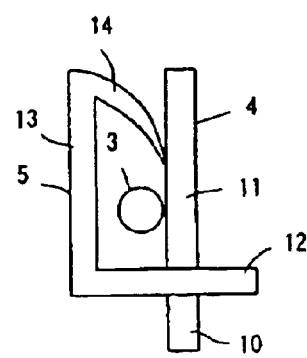

First Embodiment (FIGS. 1 to 3)

FIG. 1 is a schematic perspective view showing a state where a wire retainer is fixed onto a circuit board according to a first embodiment of the invention, and FIG. 2 is a schematic sectional view showing a state where the wire retainer is fixed onto the circuit board. A wire retainer 2 fixed onto a circuit board 1 is made up of a long cylindrical body 4 made of metal and serving as a supporting member and a retainer member 5 molded by a flexible material an the wire retainer 2 retains a wire 3 such as a lead wire.

The long cylindrical body 4 has a lower portion 10 fixed to the circuit board 1 (hereinafter referred to as fixed part 10), and the fixed part 10 is inserted into a hole 7 which is defined in the circuit board 1, and through which an electronic component is mounted on the circuit board 1, so that the fixed part 10 is fixed to the circuit board 1.

A conductive pattern 15 is printed in advance at the periphery of the hole 7, and the fixed part 10 and the conductive pattern 15 are fixed to each other by a solder 16. The solder 16 may be applied to both the fixed part 10 and the conductive pattern 15 in the same manner as a case where other electronic components are mounted on the circuit board 1.

A base part 12 of the retainer member 5 is fixed to the long cylindrical body 4 at substantially a central portion 6 thereof. The base part 12 is formed substantially rectangular and has an extension part 13 projected upward from one side thereof. One end of a restriction part 14 is integrally molded with the upper end of the extension part 13. The restriction part 14 is formed such that it extends downward along the long cylindrical body 4 as it directs to the other end thereof, and the other end is tapered and pushed against an upper portion 11 of the long cylindrical body 4.

The upper portion 11 above the central portion 6 of the long cylindrical body 4 to which the base part 12 is fixed is covered with an insulating material at the entire surface, thereby preventing short of electricity from flowing from the lead wire 3 to the metallic long cylindrical body 4.

FIG. 3 is a view for explaining a case where the lead wire 3 is inserted into the wire retainer 2. First, the lead wire 3 is positioned between the restriction part 14 of the retainer member 5 and the upper portion 11 of the long cylindrical body 4. Since the restriction part 14 is formed to extend downward along the upper portion 11, a gap is defined between the restriction part 14 and the upper portion 11, and the lead wire 3 is pushed toward the gap (see FIG. 3(a)). If the lead wire 3 is further pushed toward the gap, the restriction part 14 is curbed toward the extension part 13 and the extension part 13 is bent outward since the retainer member 5 is molded with a flexible material, and the lead wire 3 is further pressed into the gap defined between the restriction part 14 and the upper portion 11 (see FIG. 3(b)). At this time, since the long cylindrical body 4 is made of metal, it is hardly bent, so that the lead wire 3 moves downward along the surface of the upper portion 11, thereby performing a smooth insertion of the lead wire 3. If the lead wire 3 goes beyond the tip end of the restriction part 14, the restriction part 14 returns to its original position where it is brought into contact with the upper portion 11. Accordingly, the lead wire 3 is retained in a space surrounded by the base part 12, the extension part 13, the restriction part 14 and the upper portion 11, and the restriction part 14 is brought into contact with the upper portion 11, so that the lead wire 3 is prevented from being come off with certainty.

Figure 4:
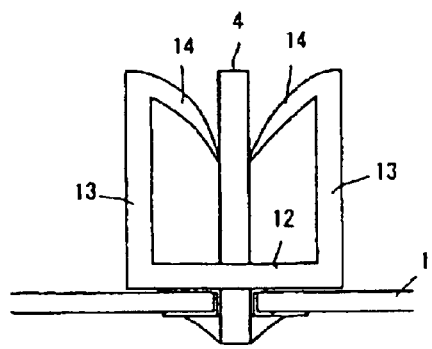
FIG. 4 is a schematic sectional view of a wire retainer according to a second embodiment of the invention.

Second Embodiment (FIG. 4):

FIG. 4 is a view of a wire retainer according to a second embodiment of the invention. According to the second embodiment, respective extension parts 13 project from opposite sides of a base part 12 of a retainer member 5 and restriction parts 14 are integrally molded with the extension part 13 at the upper ends thereof. Accordingly, it is possible to retain wires such as lead wires at both sides of the long cylindrical body 4 so that more wires can be retained.

Figure 5:
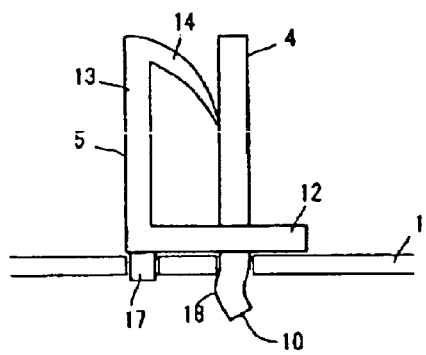
FIG. 5 is a schematic sectional view of a wire retainer according to a third embodiment of the invention.

Third Embodiment (FIG. 5):

According to a wire retainer of a third embodiment shown in FIG. 5, a protrusion 17 is formed on the lower surface of a base part 12 of a retainer member 5 and it is inserted into and mounted on a hole which is defined in a circuit board 1 when a wire retainer 2 is fixed to the circuit board 1. A fixed part 10 of a long cylindrical body 4 at the lower portion thereof has a bent part 18 by forming. In the third embodiment, since the fixed part 10 and the protrusion 17 are inserted into and fixed to two holes of the circuit board 1, the turning of the wire retainer 2 is prevented, so that the wire retainer 2 can be more firmly fixed to the circuit board 1. Since the bent part 18 is formed on the fixed part 10, the wire retainer 2 can be fixed to the circuit board 1 without effecting soldering, and hence it is suitable for a case where the wire retainer 2 is fixed to the circuit board 1, e.g., after the electronic components are mounted on the circuit board 1.

Figure 6:
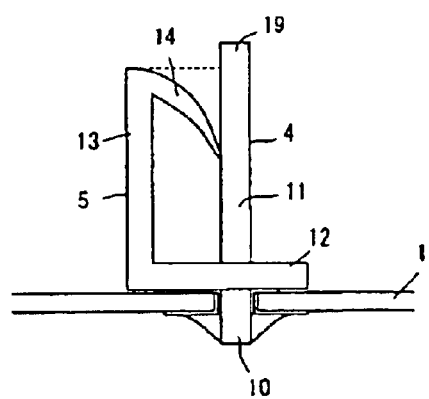
FIG. 6 is a schematic sectional view of a wire retainer according a fourth embodiment of the invention.

Fourth Embodiment (FIG. 6):

Further, according to a fourth embodiment, as shown in FIG. 6, if the upper end of an upper portion 11 of a long cylindrical body 4 is formed to have a portion 19 which is higher than the tip end of the retainer member 5, when a lead wire 3 is inserted in a space defined between the long cylindrical body 4, the retainer member 5 and the base part 12 through a gap defined between the restriction part 14 and the long cylindrical body 4, it may be positioned while brought into contact with the portion 19 of the upper portion 11, thereby enabling the lead wire 3 to be inserted in the space with more simplicity.

Although according to the first to fourth embodiments of the invention, the retainer member is made up of the rectangular base part and the extension part 13 standing upright therefrom, it may be of a circular arc or of any shape if it can retain the lead wire. Further, although the restriction part 14 is rendered in a state where it is pressed against the upper portion 11 of the long cylindrical body 4, it may be sufficient to have a slight gap between the restriction part 14 and the upper portion 11. It is permitted to have a gap to an extent that the lead wire 3 is prevented from being come off after the lead wire is pressed. Further, according to the first to fourth embodiments of the invention, although the long cylindrical body 4 is exemplified as the supporting member, the shape of the supporting member may be of any shape other than the long cylindrical shape. The upper portion 11 may be formed, e.g., of a plate shape and of any shape if the lead wire can be easily inserted. Still further, the fixed part 10 may have any shape if it can be inserted into the hole defined in the circuit board 1. Further, the number of the long cylindrical body 4 may be multitude to improve strength, and hence it is not limited to a specific number.

As mentioned in detail above, according to the invention, the wire can be easily inserted and prevented from being come off. That is, since the insertion hole of the wire is formed by the metallic supporting member and the restriction part of the retainer member formed to extend downward along the supporting member, and the supporting member is made of metal, even if a material having a small flexibility to some extent is employed by the retainer member, the retainer member is deformed by the insertion and pressing of the wire so that the wire can be easily inserted into the space defined by the components of the wire retainer. Further, since the restriction part extends downward and the supporting member is made of metal, the insertion hole of the wire is less deformed to prevent the wire from being come off.

Still further, since the supporting member is made of metal, it can be easily fixed to the hole of the circuit board through which an electronic component is inserted and mounted by soldering like the other electronic components. More still further, the mounting of the wire retainer can be automated like the other electronic components, and hence it can be more simply fixed to the circuit board. Since the holes thorough which the electronic components are mounted are defined in the circuit board so as to generally cope with various circuit patterns according to a design of the circuit, there exists a hole which is not used for certain circuit pattern. The wire retainer of the invention can replace such a non-use hole with the hole for the wire retainer and also the wire retainer of the invention can be fixed to the circuit board even after the electronic components were mounted on the circuit board.

Further, since the base part is formed at both sides of the supporting member, the number of wires to be retained can be increased. Still further, the upper portion of the part of the long cylindrical body to which the retainer member of the supporting member is fixed is covered with the insulating material to prevent short of electricity from flowing from the wire from to the supporting member. More still further, since the protrusion capable of being inserted into the hole defined in the circuit board is provided on the lower surface of the base part, the wire retainer can be surely fixed to the circuit board with certainty to prevent it from being turned. Since the holes through which an electronic component is mounted are almost defined in the circuit board as paired, the hole through which the protrusion provided on the lower surface of the base part is inserted and fixed together with the hole for the supporting member can use these pair of holes. Accordingly, the fixation of the wire retainer to the circuit board can be easily mechanically effected by use of an automatic mounting device for use in the mounting of other electronic components.

What is claimed is:

1. A wire retainer comprising:
a supporting member having a fixed part at a lower portion, said fixed part being fixed to a hole defined in a circuit board;
a retainer member fixed to the supporting member for retaining a lead wire;
wherein the retainer member has a base part fixed to a central portion of the supporting member and extended upward to retain the wire, and a restriction part fixed to an upper end of the base part at its one end and extending downward from one end to the other end along an upper portion of the supporting member, the upper portion of the supporting member being positioned above the central portion thereof to which the retainer member is fixed and being covered with an insulating material.

2. The wire retainer according to claim 1, wherein the base part is fixed to the central portion of the supporting member and extended upward from both sides thereof to define upper end portions of said base part, and restriction parts are fixed to each of said upper end portions of the base part.

3. The wire retainer according to claim 1, wherein the retainer member is made of a flexible material.

4. The wire retainer according to claim 1, wherein a protrusion which can be inserted into and fixed to a hole defined in the circuit board is provided on a lower surface of the base part.

5. The wire retainer according to claim 1, wherein the fixed part of the supporting member is fixed to the hole through which electronic components are mounted by soldering.

6. A wire retainer comprising:
an elongate supporting member having an upper portion and a lower portion; and
a retainer member received on the elongate supporting member for retaining a wire, the retainer member having a base part, which is received on a central portion of the elongate supporting member between the upper and lower portions, and which extends upward to an upper end of the base part, and a restriction part, which is fixed to the upper end of the base part and which extends downward therefrom toward the upper portion of the supporting member,
wherein the lower portion of the elongate supporting member is configured to be fixed to a hole defined in a circuit board and the wire is retained in a space defined by the base part and the restriction part of the retainer member, respectively, and the upper portion of the elongate supporting member.

7. The wire retainer according to claim 6, wherein the lower portion of the elongate supporting member is configured to be fixed to a hole in the circuit board to which electronic components are mounted by soldering.

8. The wire retainer according to claim 6, wherein the lower portion of the elongate supporting member includes a portion made of metal.

9. The wire retainer according to claim 8, wherein at least some portion of the upper portion of the elongate supporting member, positioned above the central portion thereof to which the retainer member is fixed, is covered with an insulating material.

10. The wire retainer according to claim 6, wherein the base part is fixed to the central portion of the elongate supporting member and includes dual extension parts which extend upward from opposite sides of the base part such that each of said extension parts defines a respective upper end and includes a respective restriction part.

11. The wire retainer according to claim 6, wherein at least some portion of the upper portion of the elongate supporting member, positioned above the central portion thereof to which the retainer member is fixed, is covered with an insulating material.

12. A wire retainer comprising a cylindrical supporting member made of metal and having an upper portion and a fixed part at a lower portion, said fixed part being fixed to a hole defined in a circuit board;
 a retainer member fixed to the supporting member for retaining a lead wire;
 wherein the retainer member has a base part which is fixed to a central portion of the supporting member and extends upward to retain the wire, and a restriction part which is fixed to an upper end of the base part at its one end and extends downward from one end to the other end along the supporting member, and
 wherein the wire is retained in a space surrounded by the base part and restriction part of the retainer member, respectively, and the upper portion over the cylindrical body to which the base part of the retainer member is fixed.

13. The wire retainer according to claim 12, wherein the fixed part of the supporting member is fixed to the hole through which electronic components are mounted by soldering.

14. The wire retainer according to claim 12, wherein the base part is fixed to the central portion of the supporting member and extended upward from both sides thereof, and restriction parts are fixed to each upper end of the base part.

15. The wire retainer according to claim 12, wherein the retainer member is made of a flexible material.

16. The wire retainer according to claim 12, wherein an upper portion of the supporting member positioned above a part thereof to which the retainer member is fixed is covered with an insulating material.

17. The wire retainer according to claim 12, wherein a protrusion which can be inserted into and fixed to a hole defined in the circuit board is provided on a lower surface of the base part.

18. The wire retainer according to claim 12, wherein the lower portion of the supporting member is solderable and the upper portion includes an insulating material to prevent electrical conductivity between the wire and the circuit board through the supporting member.

19. The wire retainer according to claim 18, wherein the retainer member includes an insulating material.

* * * * *